US009867320B2

(12) United States Patent
Watanabe et al.

(10) Patent No.: US 9,867,320 B2
(45) Date of Patent: Jan. 9, 2018

(54) APPARATUS FOR MOUNTING ELECTRONIC COMPONENT

(71) Applicant: Panasonic Intellectual Property Management Co., Ltd., Osaka (JP)

(72) Inventors: Hideaki Watanabe, Yamanashi (JP); Shigeki Imafuku, Yamanashi (JP); Toshiyuki Koyama, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 237 days.

(21) Appl. No.: 14/528,364

(22) Filed: Oct. 30, 2014

(65) Prior Publication Data

US 2015/0128411 A1 May 14, 2015

(30) Foreign Application Priority Data

Nov. 13, 2013 (JP) ................................ 2013-234698

(51) Int. Cl.
*B23P 19/00* (2006.01)
*H05K 13/04* (2006.01)
*H05K 3/30* (2006.01)

(52) U.S. Cl.
CPC ......... *H05K 13/0404* (2013.01); *H05K 3/306* (2013.01); *H05K 2203/0182* (2013.01); *H05K 2203/167* (2013.01); *Y10T 29/49139* (2015.01); *Y10T 29/53178* (2015.01); *Y10T 29/53183* (2015.01)

(58) Field of Classification Search
CPC ......... Y10T 29/53174; Y10T 29/53265; Y10T 29/49133; Y10T 29/5313; Y10T 29/53178; H05K 3/301; H01R 12/58
USPC ......... 29/741, 709, 714, 739, 740, 742, 743, 29/783, 785, 786
See application file for complete search history.

(56) References Cited

U.S. PATENT DOCUMENTS 4,569,550 A * 2/1986 Harigane ........... H05K 13/0404 29/741
7,313,860 B2 * 1/2008 Takahashi .......... H05K 13/0069 29/593

FOREIGN PATENT DOCUMENTS

JP S58-075014 A 5/1983
JP 2000-261194 A 9/2000

OTHER PUBLICATIONS

JP-OA 2013-234698 dated Jan. 26, 2016 for Japanese Patent Application No. 2013-234698.

* cited by examiner

*Primary Examiner* — Thiem Phan
(74) *Attorney, Agent, or Firm* — Pearne & Gordon LLP

(57) ABSTRACT

Provided is an apparatus for mounting an electronic component having a plurality of board insert type leads on a board. The apparatus includes a mounting head having a first chuck unit which chucks one of the plurality of leads of the electronic component, a second chuck unit which chucks another one of the plurality of leads and a position adjusting unit which changes relative positions of the first chuck unit and the second chuck unit to hold the electronic component, and a mounting head moving unit which moves the mounting head to insert the leads of the electronic component held by the mounting head respectively into lead insert holes provided in the board.

7 Claims, 9 Drawing Sheets

1
22 22a 22b 22b 13 22c 21 3 11 2 12 3 14 3 3 Z X Y

APPARATUS FOR MOUNTING ELECTRONIC COMPONENT

CROSS REFERENCE TO RELATED APPLICATIONS

The present application is based on and claims the benefit of Japanese patent application No. 2013-234698 filed on Nov. 13, 2013, the contents of which are incorporated by reference in its entirety.

BACKGROUND OF THE INVENTION

1. Field of the Invention

The present invention relates to an apparatus and a method for mounting an electronic component having a plurality of board insert type leads on a board.

2. Description of the Related Art

An electronic component mounting apparatus which mounts an electronic component having a plurality of board insert type leads on a board is usually formed to move a mounting head which grips a main body part (a body part) of the electronic component by a chuck member so that the leads provided in the electronic component are respectively inserted into lead insert holes provided in the board (for instance, JP-A-2000-261194).

SUMMARY OF THE INVENTION

However, since the chuck member of the usual electronic component mounting apparatus is extremely low in general-purpose property for a difference of size or form of the component, kinds of electronic components which can be met by the single chuck member are restricted. Especially, since the sizes or the forms of the electronic components referred to as variant components are not standardized, the electronic component mounting apparatus which handles these electronic components as objects needs to prepare an exclusive chuck member for each of the electronic components. Accordingly, in a mounting line which treats the variant components, a problem arises that an introduction of the electronic component mounting apparatus exclusively used for the variant components does not progress in view of working cost and an operation in the mounting line yet depends on a human power.

Thus, it is an object of the present invention to provide an apparatus and a method which increase a general-purpose property for a size or a form of an electronic component and improve a working cost.

There is provided an apparatus for mounting an electronic component having a plurality of board insert type leads on a board, the apparatus including a mounting head having a first chuck unit which chucks one of the plurality of leads of the electronic component, a second chuck unit which chucks another one of the plurality of leads and a position adjusting unit which changes relative positions of the first chuck unit and the second chuck unit to hold the electronic component, and a mounting head moving unit which moves the mounting head to insert the leads of the electronic component held by the mounting head respectively into lead insert holes provided in the board.

There is provided a method for mounting an electronic component having a plurality of board insert type leads on a board, the method including a holding process which chucks one of the plurality of leads of the electronic component by a first chuck unit and chucks another one of the plurality of leads by a second chuck unit to hold the electronic component, wherein relative positions of the first chuck unit and the second chuck are changed, and an inserting process which inserts the leads of the electronic component held in the holding process respectively into lead insert holes provided in the board.

According to the present invention, the general-purpose property for the size or the form of the electronic component can be increased and the working cost can be extremely improved.

DETAILED DESCRIPTION OF THE EXEMPLARY EMBODIMENTS

Figure 1:
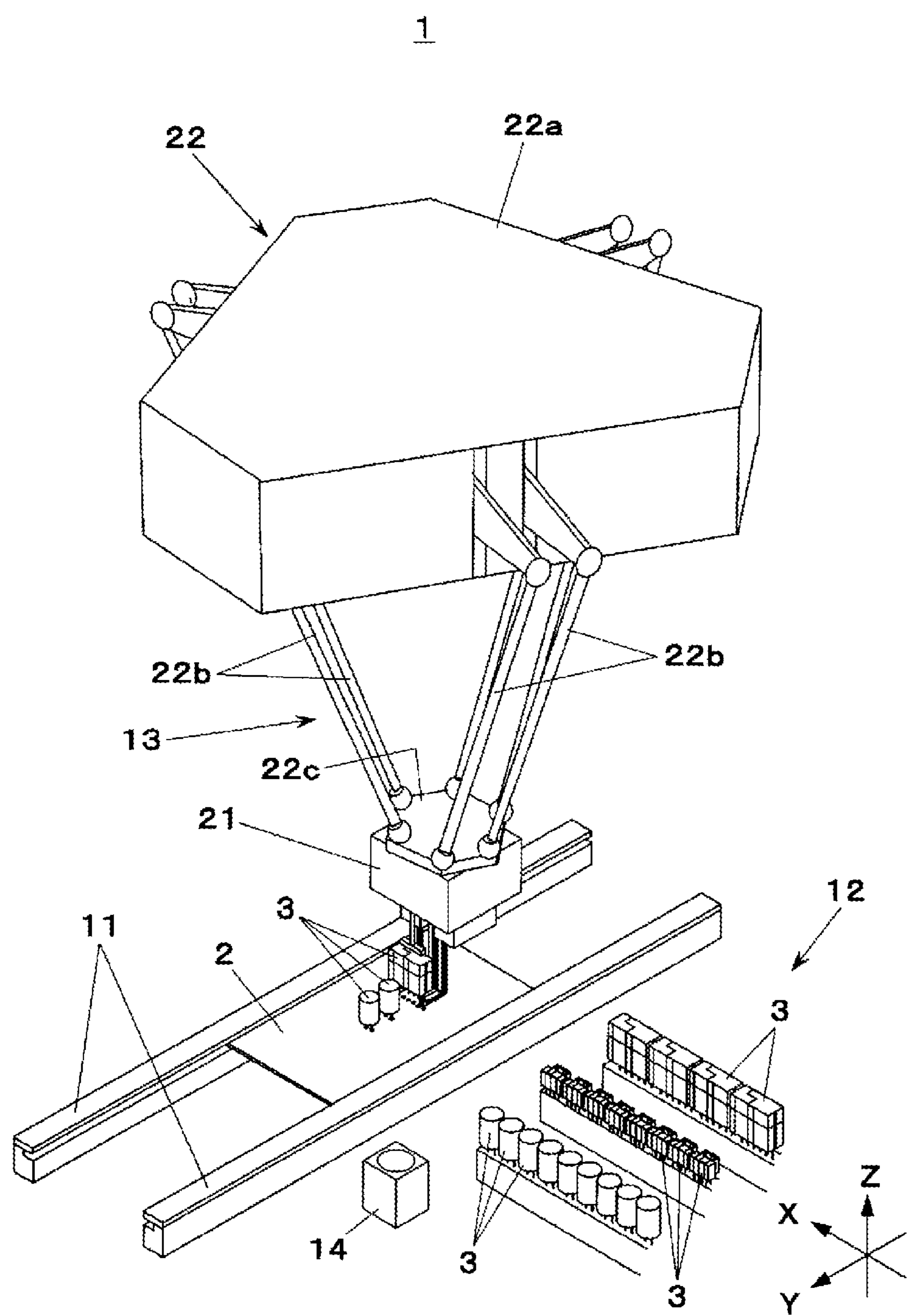
FIG. 1 is a perspective view of an electronic component mounting apparatus in one exemplary embodiment of the present invention.
Figure 2:
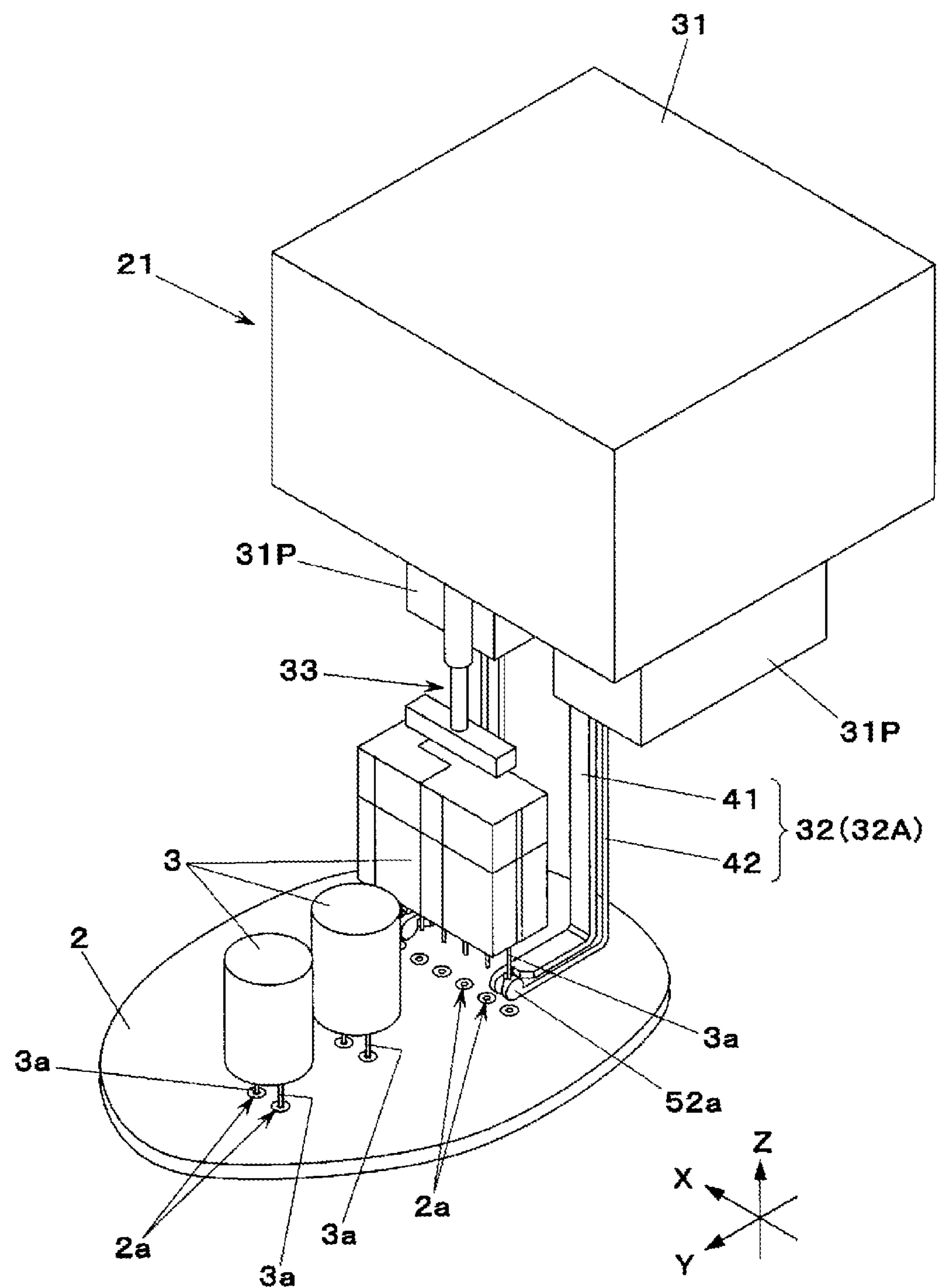
FIG. 2 is a perspective view showing a mounting head provided in the electronic component mounting apparatus in the one exemplary embodiment of the present invention together with electronic components and a board.

Now, referring to the drawings, an exemplary embodiment of the present invention will be described below. An electronic component mounting apparatus 1 shown in FIG. 1 is an apparatus which mounts an electronic component 3 on a board 2. The electronic component mounting apparatus 1 includes a board carrying conveyor 11 which conveys the board 2 and positions the board 2 in a prescribed working position, a component feeder 12 which feeds various kinds of electronic components 3, a component mounting mechanism 13 provided in an upper part of the board carrying conveyor 11 and a recognition camera 14 installed with its image pick-up visual field directed upward. As shown in FIG. 2, the electronic component 3 has a plurality of board insert type leads 3*a* which are extended downward. On the board 2, a plurality of lead insert holes 2*a* are provided so as to meet arrangements of the leads 3*a* of the electronic components 3 respectively.

In FIG. 1, the component mounting mechanism 13 includes a mounting head 21 and a mounting head moving mechanism 22 which moves the mounting head 21. The mounting head moving mechanism 22 includes a link rod driving mechanism 22*a* attached to a fixed member not shown in the drawing, a plurality of link rods 22*b* driven by the link rod driving mechanism 22*a* and a plate shaped end effecter 22*c* supported by the plurality of link rods 22*b*. The mounting head 21 is attached to a lower surface of the end effecter 22*c*.

The mounting head moving mechanism 22, namely, the link rod driving mechanism 22*a*, the link rods 22*b* and the end effecter 22*c* form what is called a parallel link robot. When the link rods 22*b* are driven by the link rod driving mechanism 22*a*, movements of the mounting head 21 attached to the end effecter 22*c* in directions X, Y and Z and rotating directions of rotations of the mounting head 21 on X, Y and Z axes respectively can be freely controlled. In the present exemplary embodiment, the mounting head moving mechanism 22 (the parallel link robot) formed with the link rod driving mechanism 22*a*, the link rods 22*b* and the end effecter 22*c* form a mounting head moving unit.

Figure 3:
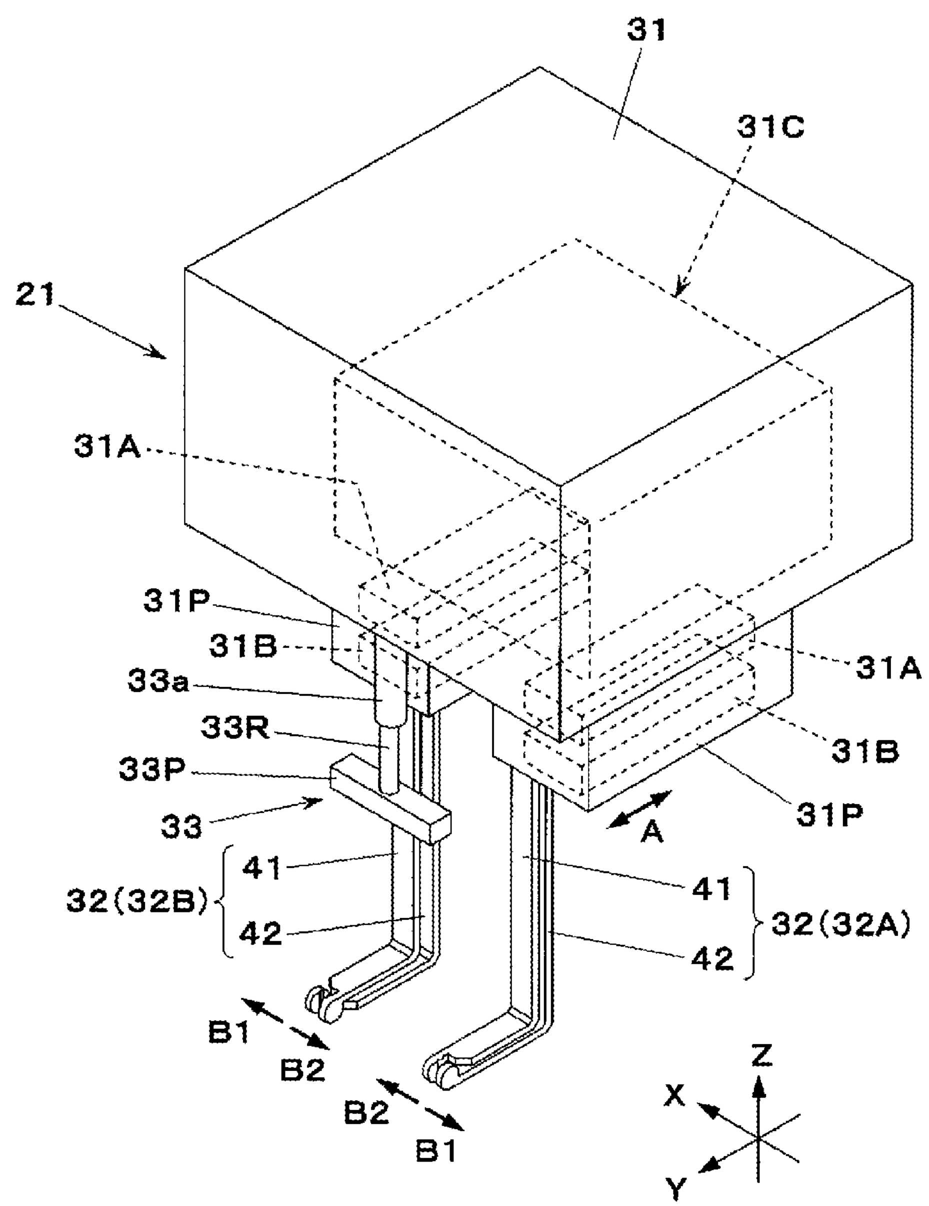
FIG. 3 is a perspective view of the mounting head in the one exemplary embodiment of the present invention.
Figure 4:
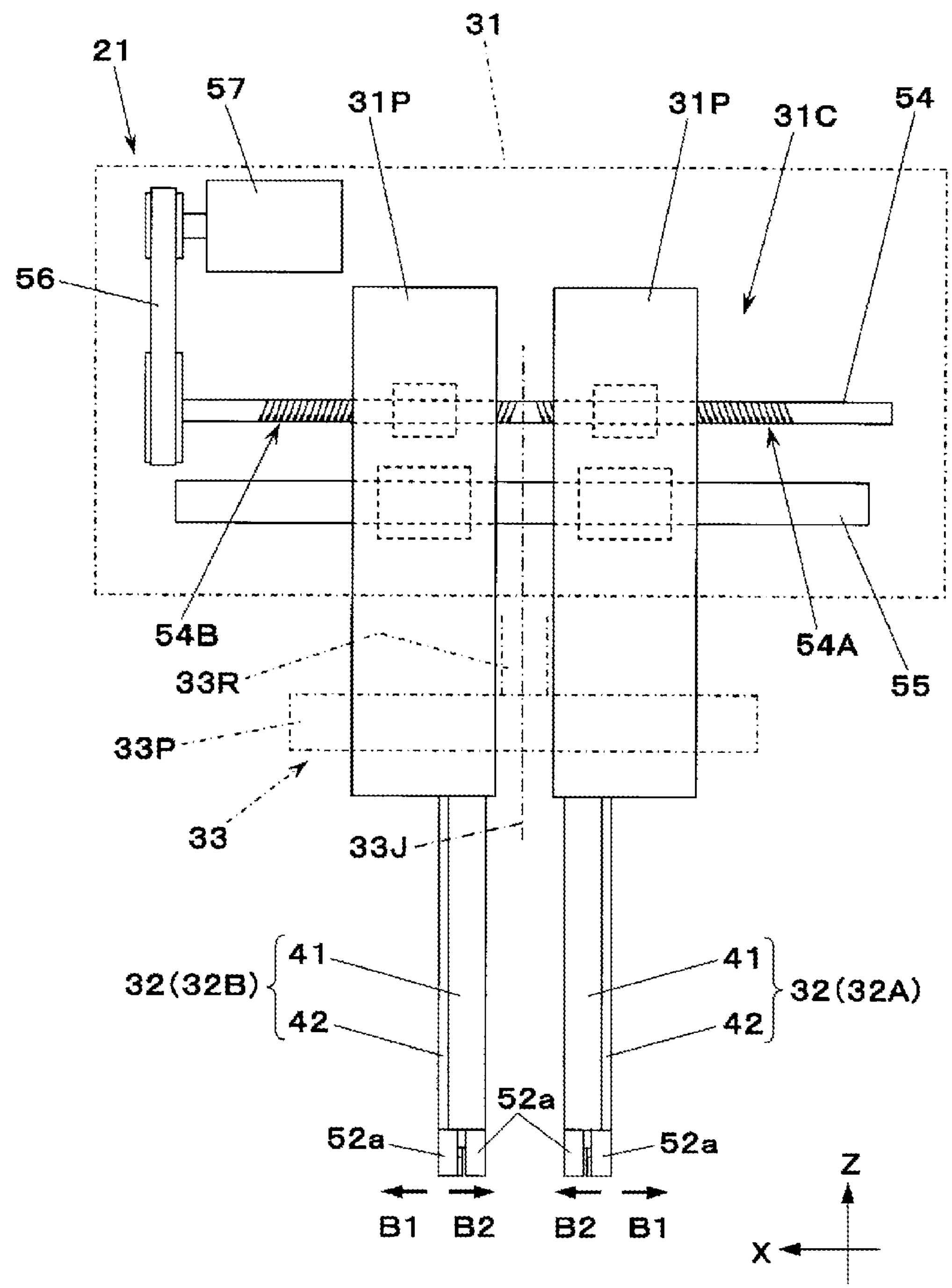
FIG. 4 is a partly enlarged front view of the mounting head in the one exemplary embodiment of the present invention.

In FIGS. 2, 3 and 4, the mounting head 21 includes a base body 31 fixed to a lower surface of the end effecter 22*c*, two chucks 32 (a first chuck 32A and a second chuck 32B) extending downward from the base body 31 and provided in parallel in a transverse direction and a pusher 33 provided in the base body 31. Each chuck 32 includes a fixed chuck member 41 and a movable chuck member 42 which are provided in parallel in the same transverse direction as the direction where the two chucks 32 are provided in parallel. The pusher 33 is formed with a pneumatic cylinder 33*a* having a pressing pad 33P attached to a lower end of a piston rod 33R. The pneumatic cylinder 33*a* operates, so that the piston rod 33R is advanced downward (an advancing operation) and the piston rod 33R is retreated upward (a retreating operation). For the convenience of explanation, the direction where the fixed chuck member 41 and the movable chuck member 42 are provided in parallel is set to an X-axis direction in the mounting head 21. Further, a direction which intersects at right angles to the X-axis direction in a horizontal plane is set to a Y-axis direction and a vertical direction is set to a Z-axis direction.

Figure 5:
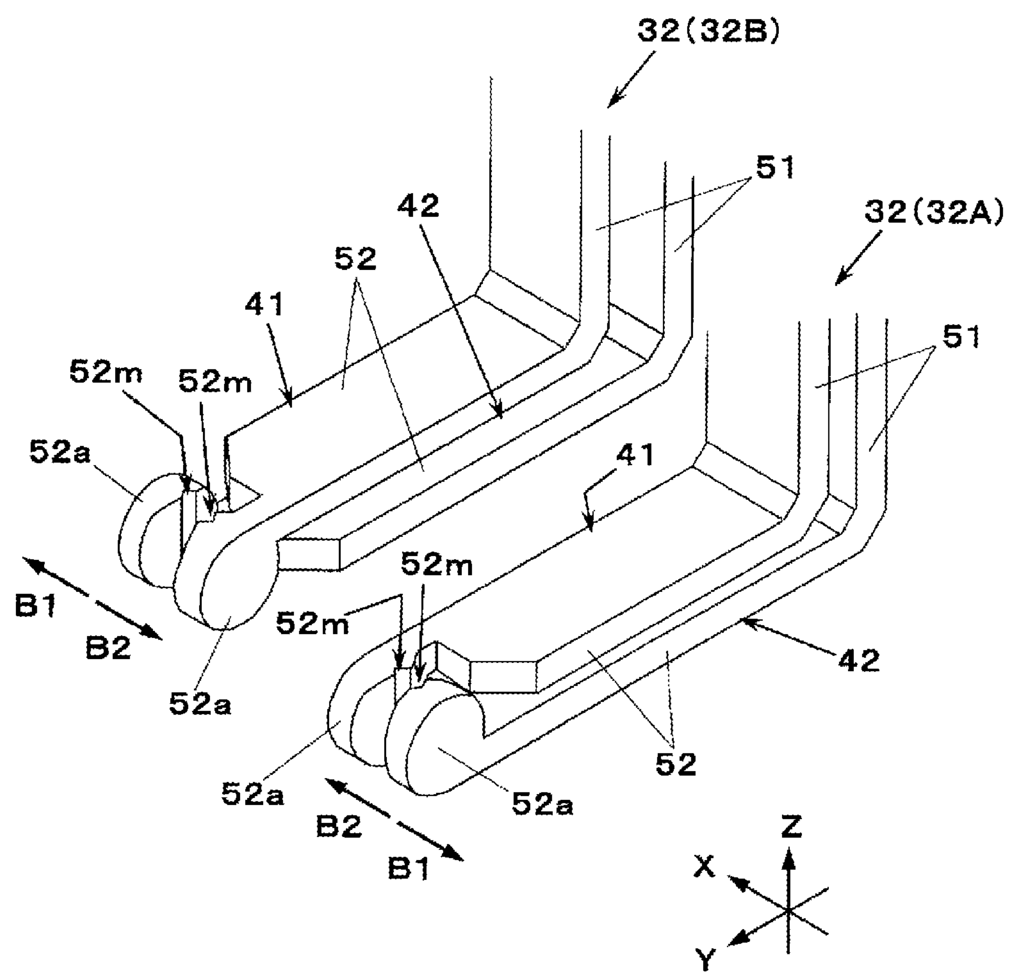
FIG. 5 is a partly enlarged perspective view of the mounting head in the one exemplary embodiment of the present invention.

In FIG. 5, the fixed chuck member 41 and the movable chuck member 42 which form each chuck 32 are respectively formed with L shaped members that have vertical parts 51 which extend downward from the base body 31 and horizontal parts 52 which extend to be bent in the Y-axis directions from lower ends of the vertical parts 51 and have grip parts 52*a* at ends. In FIG. 3, the two chucks 32 (the fixed chuck members 41 and the movable chuck members 42) respectively extend from mechanism boxes 31P provided in a lower part of the base body 31. The chucks 32 are respectively moved in the Y-axis directions (an arrow mark A shown in FIG. 3) by chuck moving mechanisms 31A accommodated in the mechanism boxes 31P and opened and closed in the X-axis directions by chuck opening and closing mechanisms 31B accommodated in the mechanism boxes 31P (the movable chuck members 42 are moved in the X-axis directions relative to the fixed chuck members 41) (arrow marks B1 and B2 shown in FIG. 3, FIG. 4 and FIG. 5). In the present exemplary embodiment, the first chuck 32A and the chuck opening and closing mechanism 31B thereof form a first chuck unit and the second chuck 32B and the chuck opening and closing mechanism 31B thereof form a second chuck unit.

In FIG. 3 and FIG. 4, the pusher 33 is provided in such a way that a vertical central axis 33J of the piston rod 33R is located in the vicinity of a center in the X-axis direction of the mounting head 21. The two chucks 32 are provided at positions where the fixed chuck members 41 are respectively equally spaced apart from the vertical central axis 33J of the piston rod 33R. The movable chuck members 42 are provided so that their grip parts 52*a* move outside (outside by setting the vertical central axis 33J of the piston rod 33R of the pusher 33 to a reference) the grip parts 52*a* of the corresponding fixed chuck members 41 in the X-axis directions.

In FIG. 3, FIG. 4 and FIG. 5, the grip part 52*a* of the fixed chuck member 41 is opposed to the grip part 52*a* of the movable chuck member 42 in the X-axis direction. When the grip part 52*a* of the movable chuck member 42 moves so as to be separated from the grip part 52*a* of the fixed chuck member 41, the chuck 32 is opened (arrow marks B1 shown in FIG. 3, FIG. 4 and FIG. 5). When the grip part 52*a* of the movable chuck member 42 moves so as to come close to the grip part 52*a* of the fixed chuck member 41, the chuck 32 is closed (arrow marks B2 shown in FIG. 3, FIG. 4 and FIG. 5). As shown in FIG. 5, in the grip part 52*a* of the fixed chuck member 41 and the grip part 52*a* of the movable chuck member 42 respectively, V shaped groove parts 52*m* are provided to extend in the Z-axis direction. Thus, the leads 3*a* of the electronic component 3 can be assuredly chucked.

In FIG. 3 and FIG. 4, a position adjusting mechanism 31C is accommodated in the base body 31. The position adjusting mechanism 31C includes a driving shaft 54 provided in the base body 31 and extending in the X-axis direction, a guide shaft 55 provided in a lower part of the driving shaft 54 and in parallel with the driving shaft 54 and a position adjusting motor 57 which rotates and drives the driving shaft 54 through a transmission belt 56. On the driving shaft 54, a first thread groove 54A and a second thread groove 54B are formed in parallel which are inverse screws to each other. The guide shaft 55 passes through the mechanism box 31P of the first chuck 32A and the mechanism box 31P of the second chuck 32B in the X-axis directions. The mechanism box 31P of the first chuck 32A is screwed to the first thread groove 54A and the mechanism box 31P of the second chuck 32B is screwed to the second thread groove 54B. Accordingly, when the position adjusting motor 57 operates to rotate and drive the driving shaft 54 through the transmission belt 56, the mechanism box 31P of the first chuck 32A and the mechanism box 31P of the second chuck 32B are moved on the driving shaft 54 so as to be separated from or come close to each other. Thus, relative positions of the two chucks 32 are changed. Namely, in the present exemplary embodiment, the position adjusting mechanism 31C serves as a position adjusting unit which changes the relative positions of the first chuck 32A and the second chuck 32B.

Figure 6:
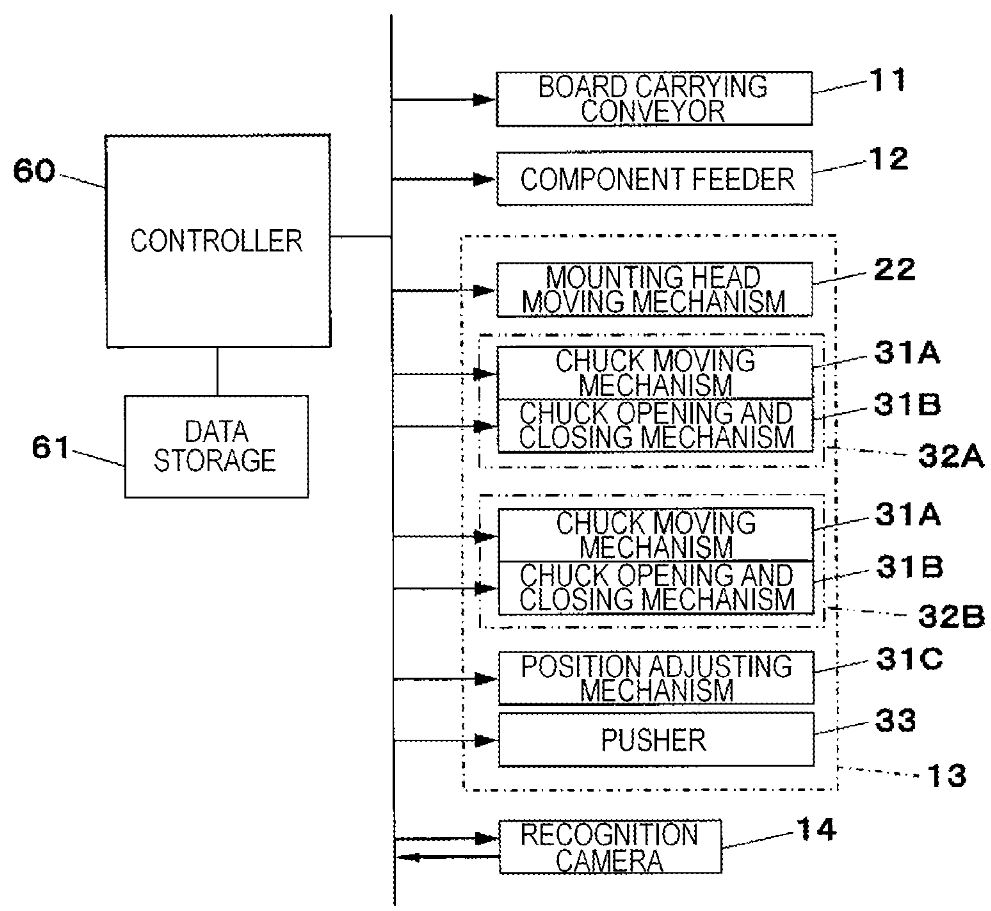
FIG. 6 is a block diagram showing a control system of the electronic component mounting apparatus in the one exemplary embodiment of the present invention.

In FIG. 6, a control of a conveying and positioning operation of the board 2 by the board carrying conveyor 11, a feed control of the electronic components 3 by the component feeder 12 and a moving control of the mounting head 21 by the mounting head moving mechanism 22 are carried out by a controller 60 provided in the electronic component mounting apparatus 1. The moving operations of the two chucks 32 (the first chuck 32A and the second chuck 32B) provided in the mounting head 21 in the Y-axis directions are carried out by controlling operations of the chuck moving mechanisms 31A corresponding respectively to the chucks 32 through the controller 60. The opening and closing operations of the two chucks 32 are carried out by controlling operations of the chuck opening and closing mechanisms 31B corresponding respectively to the chucks 32 through the controller 60. An operation for changing the relative positions of the two chucks 32 is carried out by controlling an operation of the position adjusting mechanism 31C (specifically, the position adjusting motor 57) through the controller 60. Further, the controller 60 also controls the downward advancing operation and the upward retreating operation of the pusher 33 and an image pick-up operation by the recognition camera 14. Further, the controller 60 recognizes the lead 3*a* in accordance with image data obtained by the recognition camera 14 to detect a position of the lead 3*a* of the electronic component 3 held by the mounting head 21. In the present exemplary embodiment, a function of the recognition camera 14 and the controller 60 for detecting the position of the lead 3*a* serves as a recognizing unit.

In FIG. 6, in a data storage 61 (a data storing unit) connected to the controller 60, positional relation data which determines relative positional relation of the first chuck 32A and the second chuck 32B is stored for each of the electronic components 3 mounted on the board 2. The controller 60 operates the position adjusting motor 57 in accordance with the positional relation data stored in the data storage 61 before the controller 60 allows the two leads 3*a* to be chucked by the first chuck 32A and the second chuck 32B to adjust the relative positions of the two chucks 32 (the first chuck 32A and the second chuck 32B) so that the two leads 3*a* located at substantially symmetrical positions from a central part of the electronic component 3 may be chucked by the two chucks 32.

As described above, in the present exemplary embodiment, the controller 60 serves as a position adjusting control unit which operates the position adjusting mechanism 31C in accordance with the data (the position relation data) stored in the data storage 61 before the mounting head 21 chucks the one lead 3*a* by the first chuck 32A and the other lead 3*a* is chucked by the second chuck 32B to adjust the relative positions of the first chuck 32A and the second chuck 32B.

Now, a procedure (an electronic component mounting method), will be described below, for carrying out a mounting operation of the electronic component 3 on the board 2 by the electronic component mounting apparatus 1 with the above-described structure. The controller 60 carries out the mounting operation of the electronic components 3 on the board 2 by operating structure component parts respectively such as the board carrying conveyor 11, the component feeder 12 and the mounting head moving mechanism 22.

In the mounting operation of the electronic parts 3 on the board 2, the board carrying conveyor 11 is operated to convey and position the board 2 in the prescribed working position. Then, the component feeder 12 feeds the electronic components 3, the mounting head 21 moves to an upper part of the component feeder 12, and then, the electronic component 3 is held by the chuck 32.

Figure 7A:
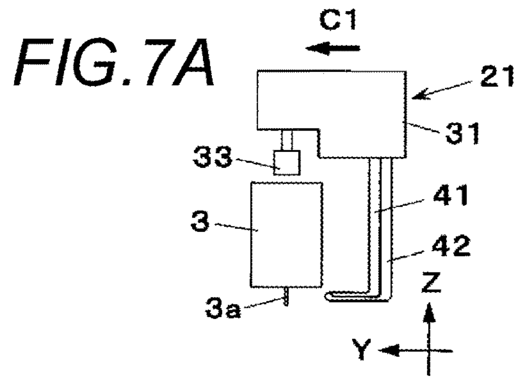
FIG. 7A to FIG. 7H are diagrams showing a procedure for carrying out a mounting operation of the electronic component on the board by the mounting head in the one exemplary embodiment of the present invention.
Figure 7B:
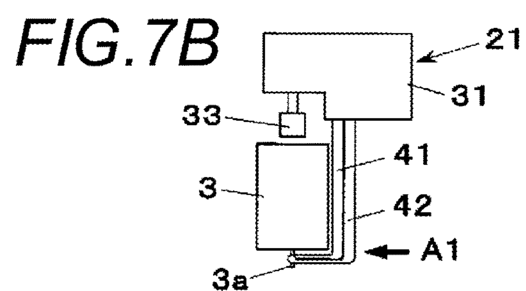

When the mounting head 21 holds the electronic component 3, initially, the mounting head comes close to the electronic component 3 from a direction which intersects at right angles to a direction where the leads 3*a* of the electronic component 3 are arranged (an arrow mark C1 shown in FIG. 7A) and the pusher 33 is located above the electronic component 3 (FIG. 7A). Then, the chuck 32 is moved so as to come close to the electronic component 3 (an arrow mark A1 shown in FIG. 7B). One of the plurality of leads 3*a* provided in the electronic component 3 is chucked by the first chuck 32A and the other one is chucked by the second chuck 32B to hold the electronic component 3 (FIG. 7(B). a holding process).

Figure 8:
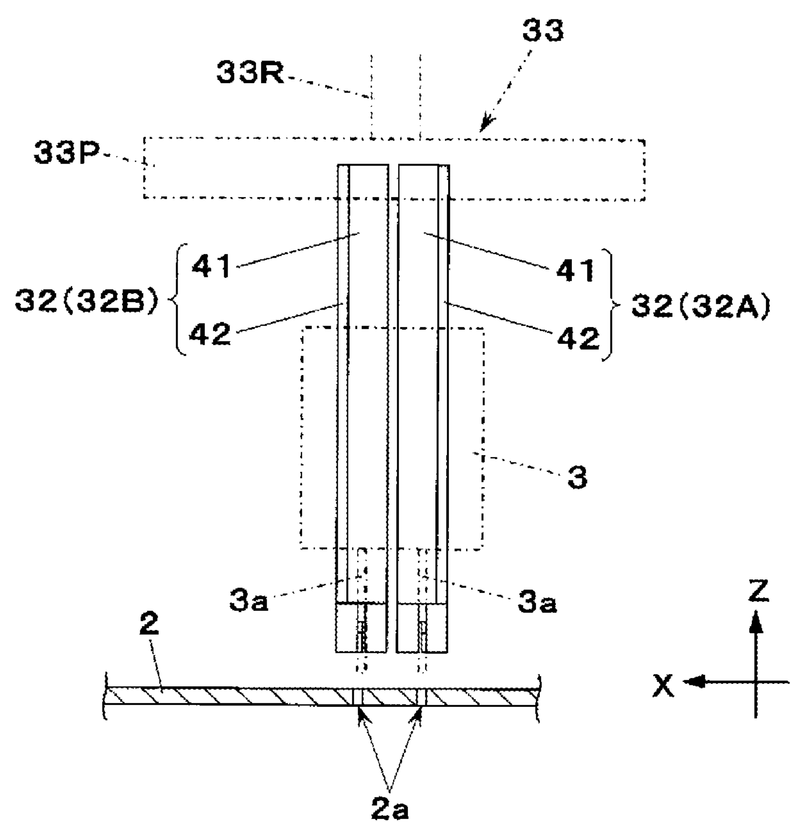
FIG. 8 is a front view showing the mounting head in the one exemplary embodiment of the present invention together with the electronic component and the board.
Figure 9:
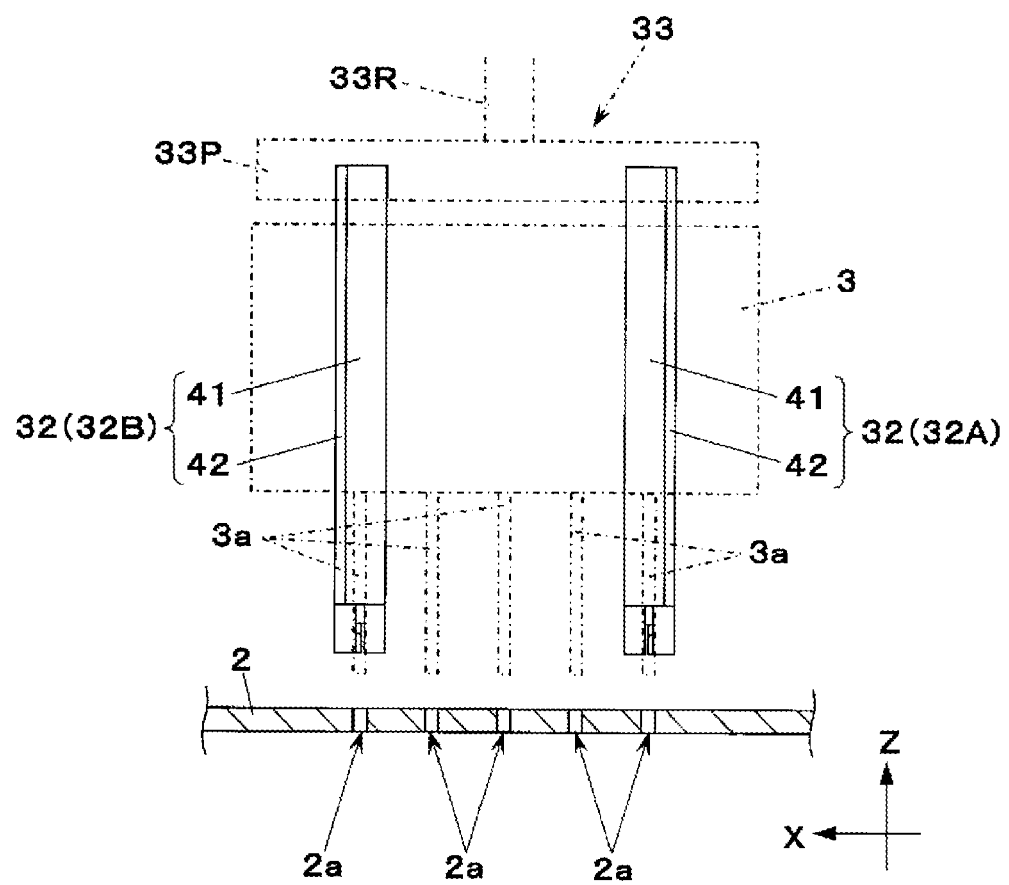
FIG. 9 is a front view showing the mounting head in the one exemplary embodiment of the present invention together with the electronic component and the board.

In the above-described holding process, the mounting head 21 chucks the two leads located at the substantially symmetrical positions from the central part of the electronic component 3 (a central part in the direction where the leads 3*a* are arranged) by the two chucks 32 (the first chuck 32A and the second chuck 32B) by a control signal sent by the controller 60 in accordance with the positional relation data stored in the above-described data storage 61. As described above, since the piston rod 33R of the pusher 33 is located at an intermediate position of the two chucks 32, under a state that the two leads 3*a* located at the substantially symmetrical positions from the central part of the electronic component 3 are chucked by the two chucks 32, the pusher 33 can be located above the central part of the electronic component 3. FIG. 8 shows a state that the electronic component 3 in which the number of the leads 3*a* is two is held by the mounting head 21. FIG. 9 shows a state that the electronic component 3 in which the number of the leads 3*a* is three or more (here, five) is held by the mounting head 21.

In the above-described holding method of the electronic component 3, a fact is paid attention that even when the size or form of the electronic component 3 is changed, the form of the board insert type lead 3*a* is little changed. Thus, when two leads of the plurality of leads 3*a* of the electronic component 3 are chucked by the two chucks 32, the electronic component 3 can be assuredly held. As shown in FIG. 8 and FIG. 9, in the above-described holding process, when the two leads 3*a* located at the most distant positions from the central part of the electronic component 3 are chucked by the two chucks 32, even if a space between the fixed chuck member 41 and the movable chuck member 42 of the chuck 32 which is opened is larger than a space between the adjacent leads 32*a*, the lead 3*a* can be chucked.

Figure 7C:
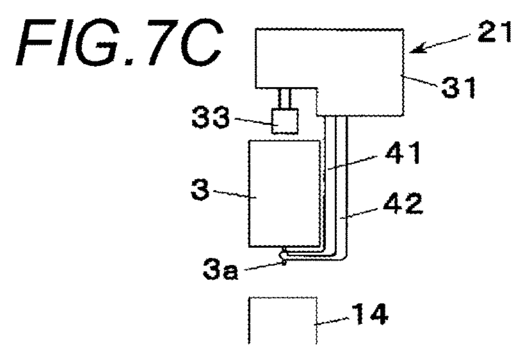

When the mounting head 21 holds the electronic component 3 by the two chucks 32, the electronic component 3 is located above the recognition camera 14 (FIG. 7C). Then, the recognition camera 14 picks up an image of the lead 3*a* of the electronic component 3 and sends image data obtained by an image pick-up operation to the controller 60. The controller 60 recognizes the leads 3*a* of the electronic component 3 respectively held in the holding process from the image data (a recognizing process). Here, the controller 60 recognizes images of all the leads 3*a* of the electronic component 3 to grasp their positions. However, since the position of the lead 3*a* chucked by the chuck 32 can be grasped from the position of the chuck 32 which chucks the lead 3*a*, in the recognizing process, other leads 3*a* than the lead 3*a* which is chucked by the chuck 32 may be merely recognized to grasp the positions. Thus, a processing time required for grasping the positions of the leads 3*a* respectively of the electronic component 3 can be shortened.

Figure 7D:
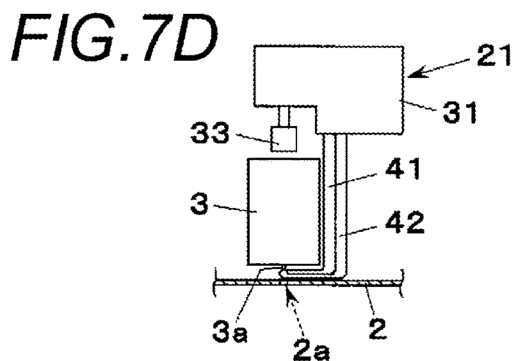
Figure 7E:
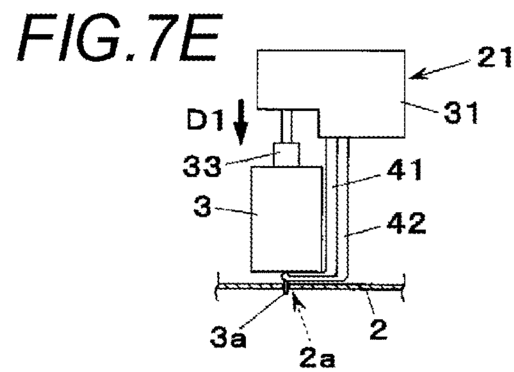

The controller 60 operates the mounting head moving mechanism 22 in accordance with the positions of the leads 3*a* grasped in the recognizing process to carry out an operation for inserting the leads 3*a* of the electronic component 3 into the lead insert holes 2*a*. Namely, the mounting head 21 positions the leads 3*a* of the electronic component 3 on the corresponding lead insert holes 2*a* respectively provided in the board 2 (a positioning process) and moves to the board 2 side to insert ends of the leads 3*a* into the lead insert holes 2*a* (an inserting process. FIG. 7D). After that, the pusher 33 advances the piston rod 33R downward to press the electronic component 3 toward the board 2 by the pressing pad 33P (an arrow mark D1 shown in FIG. 7E). Thus, the leads 3*a* of the electronic component 3 are respectively pressed into the lead insert holes 2*a* (a pressing process). At this time, the leads 3*a* are slid downward along the above-described groove parts 52*m* provided in the chucks 32.

Figure 7F:
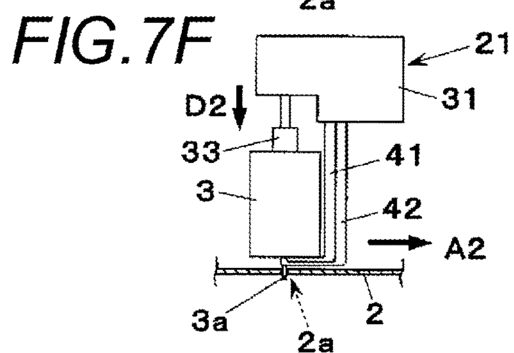

In parallel with the pressing process by the pusher 33, the chuck 32 is retreated from between the electronic component 3 and the board 2. Specifically, the chuck 32 is opened with a little delay from a timing when the pusher 33 presses the electronic component 3, and then, moves toward a direction where the chuck 32 is separated from the electronic component 3 (an arrow mark A2 shown in FIG. 7F). After the chuck 32 is retreated, the pusher 33 continuously presses the lead 3*a* (an arrow mark D2 shown in FIG. 7F) to push the lead 3*a* into the lead insert hole 2*a* to a desired depth.

Figure 7G:
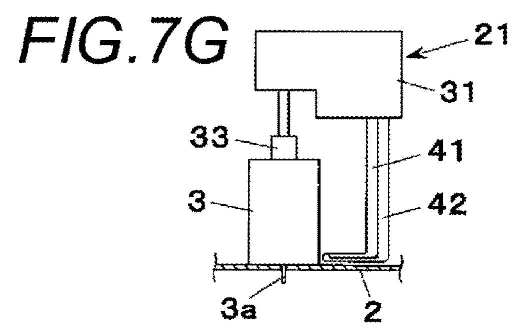
Figure 7H:
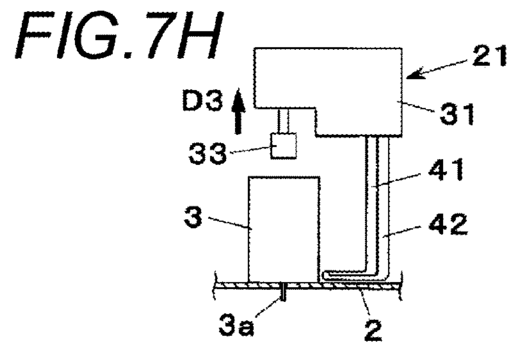

When the pusher 33 pushes the lead 3*a* into the lead insert hole 2*a* in such a manner as described above (FIG. 7G), the pusher retreats the piston rod 33R upward to separate from the electronic component 3 (an arrow mark D3 shown in FIG. 7H). Thus, a mounting operation of the electronic component 3 on the board 2 is finished (FIG. 7H). As described above, in the present exemplary embodiment, the pusher 33 serves as a pressing unit which presses the electronic component 3 whose lead 3*a* is inserted into the lead insert hole 2*a* toward the board 2 side.

As described above, in the electronic component mounting apparatus 1 (the electronic component mounting method) of the present exemplary embodiment, the fact is paid attention that even when the size or form of the electronic component 3 is changed, the form of the board insert type lead 3*a* is little changed. Thus, two leads of the plurality of leads 3*a* of the electronic component 3 are chucked by the two chucks 32 to hold the electronic component 3. Accordingly, the electronic component 3 can be held irrespective of its size or form, a general-purpose property of the electronic component mounting apparatus 1 can be improved and a working cost can be extremely improved.

The electronic component mounting apparatus and the electronic component mounting method are provided in which the general-purpose property for the size or the form of the electronic component is increased and the working cost is extremely improved.

What is claimed is:

1. An apparatus for mounting an electronic component having a plurality of board insert type leads on a board, the apparatus comprising:

a mounting head having a first chuck unit which chucks one of the plurality of leads of the electronic component, a second chuck unit which chucks another one of the plurality of leads;

a base body having a position adjusting unit which changes relative positions of the first chuck unit and the second chuck unit to change relative positions of chucking respective leads by the first chuck unit and the second chuck unit; and a mounting head moving unit which moves the mounting head to insert the leads of the electronic component held by the mounting head respectively into lead insert holes provided in the board, wherein the first chuck unit and the second chuck unit extend separately from the base body with no portion of the first chuck unit being attached to the second chuck unit.

2. The apparatus according to claim 1, further comprising:

a data storing unit in which data that determines a relative positional relation of the first chuck unit and the second chuck unit for each electronic component is stored; and a position adjusting control unit which operates the position adjusting unit in accordance with the data stored in the data storing unit to adjust the relative positions of the first chuck unit and the second chuck unit.

3. The apparatus according to claim 1, wherein the mounting head includes a pressing unit which presses the electronic component, whose leads are inserted into the lead insert holes, toward a side the board.

4. The apparatus according to claim 1, wherein the position adjusting unit of the mounting head includes a driving shaft to be rotated and driven, wherein the first chuck unit and the second chuck unit are moved through the driving shaft so as to be separated from or come close to each other.

5. The apparatus according to claim 4, wherein the position adjusting unit of the mounting head includes a guide shaft provided in parallel to the driving shaft, wherein the guide shaft passes through the first chuck unit and the second chuck unit.

6. The apparatus according to claim 1, wherein the first chuck unit includes a pair of grip parts which grip the one of the plurality of leads of the electronic component in between.

7. The apparatus according to claim 1, wherein the second chuck unit includes a pair of grip parts which grip the another one of the plurality of leads of the electronic component in between.

* * * * *